United States Patent [19]
Mims et al.

[11] 4,160,958
[45] Jul. 10, 1979

[54] SAMPLING LINEARIZER UTILIZING A PHASE SHIFTER

[75] Inventors: James H. Mims, Hanover; Francis W. Hopwood, Severna Park, both of Md.

[73] Assignee: Westinghouse Electric Corp., Pittsburgh, Pa.

[21] Appl. No.: 935,240

[22] Filed: Aug. 21, 1978

[51] Int. Cl.² ............................................. H03B 23/00
[52] U.S. Cl. ......................................... 331/178; 331/4
[58] Field of Search .................... 331/178, 4; 328/184; 325/332, 333, 334, 335, 336, 337

[56] References Cited

U.S. PATENT DOCUMENTS

| | | | |
|---|---|---|---|
| 3,382,460 | 5/1968 | Blitz et al. | 331/178 |
| 3,504,294 | 3/1970 | Martin, Jr. | 331/178 |
| 3,931,586 | 1/1976 | Carpenter | 331/178 |
| 4,038,612 | 7/1977 | Borofka | 331/4 |

OTHER PUBLICATIONS

IEEE Trans. on Aerospace and Electronics Systems, vol. AES-9, No. 5, pp. 670–678, Sep. 1976.

*Primary Examiner*—John Kominski
*Attorney, Agent, or Firm*—W. E. Zitelli

[57] ABSTRACT

A sampling linearizer including a phase shifter for use in improving the accuracy of an FM generated waveform with respect to a desired frequency rate of change is disclosed. The sampling linearizer comprises an oscillator for generating a reference frequency signal; a mixer governed by the generated FM waveform signal and the reference frequency signal to generate a first signal which is sampled at predetermined sampling times; and a linearizing servo controller which is governed by the sampled signal to reduce the inaccuracies in the generated FM waveform with respect to the desired frequency rate of change. The sampling linearizer further includes a phase shifter disposed between the oscillator and mixer thereof and operative upon the reference frequency signal to generate another signal, the phase shifter being operative to shift the phase of the another signal with respect to the reference frequency signal as governed by a sequence of control signals representative of predetermined phase shift values. Each resulting phase shift causes the first signal to have a common reference value, preferably zero, concurrent with the predetermined sampling times when the frequency rate of change of the generated FM waveform is changing substantially at the desired rate and causes the first signal to have a phase error with respect to the common reference value concurrent with the sampling times when the frequency of the generated FM waveform is not changing substantially at the desired rate. This sampled phase error first signal is representative of the inaccuracies of the generated FM waveform and is used to govern the linearizing servo controller which regulates the FM waveform generator to reduce these frequency inaccuracies and maintain the frequency of the generated FM waveform substantially at the desired rate of change.

15 Claims, 7 Drawing Figures

SAMPLING LINEARIZER UTILIZING A PHASE SHIFTER

GOVERNMENT CONTRACT CLAUSE

The invention herein described was made in the course of or under a contract bearing number F-33615-76-C-1279 or subcontract thereunder with the Department of the Air Force.

BACKGROUND OF THE INVENTION

The present invention relates to the broad field of FM waveform generation and more particularly, to a sampling linearizer which provides the sampling rate sufficient to control the accuracy of the FM waveform to that required for applications in very high resolution mapping type radar systems, for example.

In most cases, high resolution mapping type radar systems employ FM (chirp) waveform generation, usually of the linear frequency rate of change type, to achieve their specified range resolution requirements. Normally, very high resolution radars require waveforms with a bandwidth of 1,000 MHZ or greater, with time-bandwidth products of perhaps 100,000. The accuracy requirement for these high bandwidth type linear frequency rate of change type FM waveform generators is generally severe especially in air-ground radar mapping systems which map large swaths. These air-ground radar mapping systems may, in some cases, be specified to have 50 dB more stringent linearity requirements than ground-based radar systems, for example. To achieve an accuracy requirement of this nature, most FM waveform generators have included some type of servo loop control.

The most common type of servo loop control for controlling the accuracy of the desired frequency rate of change of the generated FM waveform in chirp generation employs sampling techniques and is commonly referred to as a sampling linearizer. A schematic block diagram of a typical active chirp generator utilizing a sampling linearizer is shown in FIG. 1. Typically, a FM generator 10 of the linear frequency rate of change type, for example, generates a FM microwave signal 12 at a desired frequency rate of change as governed by a tuning waveform signal 14. The desired waveform 12 which may be expressed by the well-known equation $F = F_O + kt$ is coupled to one input of a conventional mixer 15 wherein it is compared to a reference microwave signal 16 which is generated from a stable microwave oscillator 18. The frequency of the reference signal 16 is usually tuned to the initial ramp frequency $F_O$ of the desired FM waveform 12. During the dead time period just prior to the start of generation of the liner linear waveform ramp at 12, the FM generator 10 is normally phase locked to the output signal $F_O$ of stable oscillator 18. In response to the generated FM ramp signal 12, the mixer 15 generates a signal 20 which is depicted by the graph of FIG. 2. The solid line 22 in the graph of FIG. 2 which may be expressed by $F = kt$ is the desired linear FM waveform 12 beat down to baseband by mixer 15. The dotted curve 24 of the graph of FIG. 2 is representative of an exaggerated non-linear FM generated signal which needs linearization.

A synchronizer 26 which is normally synchronized to the stable oscillator 18 controls a conventional sampler 28 to sample-and-hold the signal 20 for predetermined sampling intervals $T_S$. The times at which the signal 20 is sampled are generally selected to be at $2\pi$ multiples of the phase of the desired FM waveform (refer to FIG. 3). Accordingly, the sampling interval $T_S$ is selected such that if the generated FM waveform at 12 is linear and has the correct slope, the sampler output 29 will always be substantially zero as exhibited by the points 30, 32 and 34 corresponding to sampling time $T_S$, $2T_S$ and $3T_S$ in FIG. 3. If the FM waveform at 12 has an inaccuracy such as a deviation from the desired slope k or non-linearities similar to that shown in FIG. 2, an output signal over line 29 is generated at some appropriate value for each sample to govern a linearizing servo controller 36, generally well known in the art, to generate the appropriate compensation in the tuning signal 14 which, in turn, controls the accuracy of the generated FM waveform 12 and forces the output signal over line 29 to zero.

For a more detailed description of some sampling linearizers exemplary of the type described above, reference is made to the following U.S. Pat. Nos. 3,382,460 entitled "Linearly Swept Frequency Generator" issued to D. Blitz et al on May 7, 1968; 3,699,448 entitled "Precision Generation Of Linear F.M. Signal" issued to G. L. Martin et al on Oct. 17, 1972; and 4,038,612 entitled "Swept Oscillator Automatic Linearizer" issued to R. P. Barofka et al on July 26, 1977.

In analyzing the available performance of these known type sampling linearizers, it is first identified that the desired frequency of the FM generated waveform may be expressed by $$F(t) = F_O + kt \tag{1'}$$

where $F_O$ is the initial frequency of the frequency sweep, k is the slope (Hz/second), and t is the accumulated time after waveform initialization, $T_O$. If the oscillator 18 is set at the stable frequency $F_O$, it follows that the desired waveform phase $\phi$ generated at the output of mixer 15 may be expressed by $$\phi(t) = +\pi k t^2 \tag{2'}$$

If the sampling times $\alpha T_S$ are always selected to be multiples of $2\pi$ of the desired FM waveform, it can be shown that:

$$\phi(\alpha) = 2\pi \alpha^2 = \pi k (\alpha T_S)^2 \tag{3'}$$

Thus, solving equation (3') for $T_S$, we find that $$T_S = \sqrt{2/k}. \tag{4'}$$

Thus, the sampling rate $1/T_S$ is uniquely determined by the waveform slope k.

As is well known in the pertinent art, the sampling period $T_S$ introduces a transport delay of $T_S/2$ into the servo control loop of the sampling linearizer, and this delay limits the loop bandwidth $F_{SL}$ of the servo control. Type II servo controllers are usually used for linearization. To stabilize these servo control loops when a time delay is introduced such as with the sampler, it is generally necessary to limit the excess phase effected by the sampler to approximately $\pi/8$ at the servo loop bandwidth frequency $F_{SL}$. In so doing, it may be shown that the bandwidth $F_{SL}$ is equated to $\frac{1}{8} T_S$. If equation (4') is substituted for $T_S$, the loop bandwidth may be expressed as $$F_{SL} = \frac{1}{8}\sqrt{k/2}. \tag{5'}$$

Unfortunately, this bandwidth has been found to be inadequate, in some cases, to provide the required accuracy and transient response characteristics for some applications such as the high resolution mapping type radars. A more desirable mechanization may be one which maintains the simplicity of the conventional sampling linearizer, but which provides substantially greater sampling rate and servo bandwidth.

SUMMARY OF THE INVENTION

The present invention is embodied in a FM waveform generation system which includes a sampling linearizer for improving the accuracy of the generated FM waveform signal. The sampling linearizer comprises an oscillator for generating a signal at a predetermined reference frequency; a mixer governed by the linear FM waveform signal and another signal to generate a first signal representative of the phase of the generated FM waveform signal; a sampler for sampling the first signal at predetermined sampling times to generate a second signal representative of the inaccuracies in the generated FM waveform; and a linearizing servo controller governed by the second signal to reduce the inaccuracies in the FM waveform generation.

In accordance with the principles of the present invention, a phase shifter is disposed between the oscillator and mixer of the sampling linearizer. This phase shifter is operative upon the predetermined reference frequency signal of the oscillator to generate the another signal, the phase shifter being operative to shift the phase of the another signal with respect to the predetermined reference frequency signal as governed by a sequence of control signals representative of predetermined phase shift values. Each phase shift value in the sequence corresponds to the desired phase values of the first signal which are concurrent with the predetermined sampling times. Consequently, each phase shift operation causes the first signal to have a common reference value, preferably a zero, concurrent with the predetermined sampling times when the frequency of the generated FM waveform signal is changing substantially at a desired rate and causes the second signal to have a value indicative of a phase error with respect to the common reference value concurrent with the predetermined sampling times at times when the frequency of the generated FM waveform is not changing substantially at the desired rate.

More specifically, in a FM waveform generation system having a desired linear frequency rate of change, each predetermined phase shift value is proportional to the square of the accumulated sampling time corresponding thereto, the generated phase shift value being limited to approximately a range of 0 to $2\pi$. Accordingly, if the time intervals $T_S$ between the sampling times are uniform, then the predetermined phase shift values may be expressed as:

$$\phi(\alpha) = \pi k (\alpha T_S)^2,$$

where $\alpha$ is the accumulated integer number of sampling times, and k is the desired linear frequency rate of change value of the generated FM waveform. In these cases, the phase shifter is governed by the signal representative of $\phi(\alpha)$ between successive sampling times denoted by $\alpha - 1$ and $\alpha$ to shift the phase of the another signal with respect to the predetermined frequency signal by an amount proportional to $\phi(\alpha)$, the shifting operation of the phase shifter being substantially concluded prior to the sampling time denoted as $\alpha$.

DESCRIPTION OF THE PREFERRED EMBODIMENT

Figure 1:
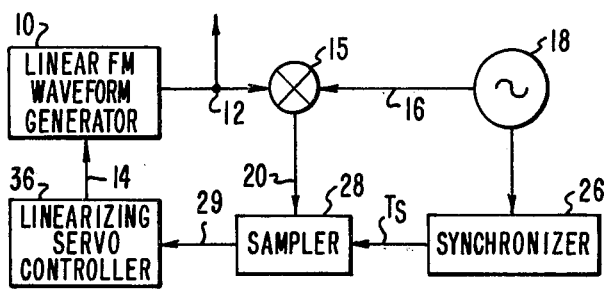
FIG. 1 is a schematic block diagram of a linear FM waveform generation system including a sampling linearizer.

A sampling linearizer of the type described hereinabove in connection with FIG. 1 is found suitable for use in describing the principles of the present invention. A phase shifter 40 is added to the embodiment of FIG. 1 disposed between the oscillator 18 and mixer 15. The phase shifter 40 is governed by the synchronizer 26', which has been suitably adapted for these purposes and will be described in greater detail hereinbelow, to provide a phase shift to the predetermined frequency signal 16 to generate a phase shifted signal 16' which is coupled to one input of the mixer 15. A digitally controlled phase shifter 40 was found suitable for use in the present embodiment; however, it is understood that one of an analog type may also be used without deviating from the invention principles.

In addition, while the present embodiment is being described in the context of a FM waveform generation system of the type having a desired linear frequency rate of change FM waveform, it is understood that the principles of applicants' invention are not to be so limited, but rather are to be extended broadly to the FM waveform generation systems having other frequency rate of characteristics also.

As has been described in the Background section above, the initial frequency $F_O$ of a FM generated waveform 12 having a linear frequency rate of change is phase locked with the predetermined frequency signal 16', which is usually adjusted at $F_O$ also. The phase shifter 40 is generally set at 0 phase shift change during this phase locking period which occurs just prior to FM waveform ramp generation, in most cases. Thus, signal 16' is phase stable with respect to the signal 16 during phase lock. The mixer 15 generates signal 20, which is representative of the phase difference between signals 12 and 16'. If signal 12 is not in phase quadrature with signal 16', the sampler 28 being controlled to sample signal 20 at predetermined sampling times by the synchronizer 26' generates a sample-and-hold type phase error signal over line 29. The phase error signal 29 governs the conventional servo controller 36, normally but not limited to the type II variety, to generate a tuning signal 14 which tunes the FM waveform generator 10 in a manner well known to those skilled in the pertinent art to alter the frequency signal 12 in a way to reduce the phase error signal to a prespecified value such as zero when a type II servo controller is used, for example. During the phase lock period, signal 12 is tuned until it is in phase quadrature with signal 16' at which time the error signal at 29 is reduced to zero.

The desired frequency of the FM waveform at 12 generated by the waveform generator 10 may be expressed, in the case of a desired linear frequency rate of change, by the expression:

$$F(t) = F_O + kt \qquad (1a)$$

where $F_O$ is the initial frequency of the sweep and k is the desired frequency rate of change of the desired waveform. If the oscillator 18 is adjusted to generate a fixed frequency signal $F_O$ at 16' and the phase shifter 40 introduces no phase shift change, then the output 20 of the mixer 15 during the FM ramp may be expressed as:

$$F(t) = kt \qquad (2a)$$

and the corresponding phase which may be observed at 20 is expressed as:

$$\phi(t) = \pi k t^2 \qquad (3a)$$

Figure 3:
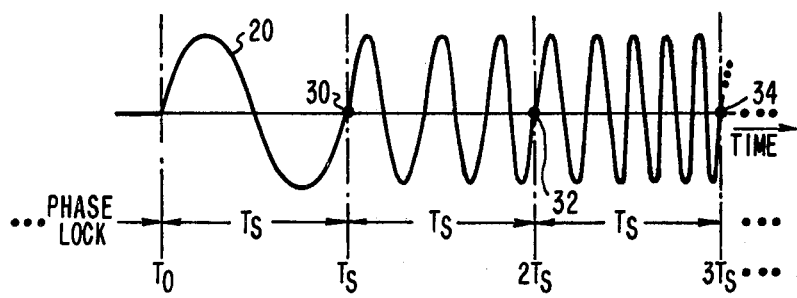
FIG. 3 is a more detailed sketch of a generated FM waveform illustrating a common reference value occurring at specified sampling times.

It has been shown that without the phase shifter 40, in order to sample at times when the phase of the mixer output is zero, the sampling intervals must be synchronously selected at $2\pi$ multiples of the predetermined frequency of signal 16 (see FIG. 3). This results in limiting the sampling frequency to $\sqrt{k/2}$ which in turn permits a servo bandwidth frequency of merely $\frac{1}{8}\sqrt{k/2}$ taking loop stability into consideration (see equations (4') and (5') above). In those cases in which the generated FM waveform is applied as part of a very high resolution radar mapping system, for example, the accuracy yielded by the sampling frequency of $\sqrt{k/2}$ does not appear adequate. With the introduction of the phase shifter 40 into the sampling linearizer and an appropriate selection of phase shift settings as calculated by the sequencer 26' which will be described in greater detail herebelow, the sampling frequency $1/T_S$ and servo loop bandwidth $F_{SL}$ may both be increased at least according to the accuracy or number of bits N of the phase shifter 40 to provide the specified accuracy in the FM generated waveform normally required for very high resolution mapping radars and the like.

To have this best understood, suppose the phase shifter 40 is an N-bit digitally controlled phase shifter being controlled by digital words precalculated by the synchronizer 26', for example, at predetermined times corresponding to a sequence of sampling times $\alpha T_S$, where $\alpha$ may be any integer from O to M and $T_S$ may either be a uniform or non-uniform sampling interval, uniform being that which is preferred for the purposes of explaining this embodiment. In utilizing an N-bit phase shifter 40, there may exist $2^N$ possible phase settings with a resolution which may be set at $2\pi/2^N$. From the discussion, supra, it is understood that it is desirable to have a waveform at 20 which exhibits a zero crossing at the sampling times $\alpha T_S$ (see FIG. 3) so that any deviation from linearity will show up as a phase error at 29 as is known to be desirable with a type II servo controller. To increase the sampling frequency $1/T_S$ beyond the $\sqrt{k/2}$ limit, the phase shift settings of the phase shifter 40 may be calculated such that the sampler always samples at $2\pi$ multiples or at conditions which simulate these conditions. One way of accomplishing this is to subtract an appropriately chosen phase $\phi(\alpha T_S)$ from the desired waveform concurrent with the sampling times $T_S$. In the FM generated waveform having a linear frequency rate of change, it can be shown that:

$$2\pi/2^N \alpha^2 = \phi(\alpha T_S) = \pi k(\alpha T_S)^2 \qquad (4a)$$

and it follows that sampling period may be expressed as $$T_S = \sqrt{2/2^N k} \qquad (5a)$$

Thus, it is shown that the sampling periods may be uniquely determined but not limited by the number of bits N (resolution) of the phase shifter 40 and the desired slope k of the generated FM waveform having a linear frequency rate of change at 12. It is understood that the sampling rate may be increased beyond the value expressed in equation (5a) above if a phase shift is not conducted concurrent with each sampling time. Assuming that a phase shift is conducted concurrent with each sampling time, it is well known that signal 29 driving the servo controller 36 is delayed $T_S/2$ by the sampling process of the sampler 28. It is further well known that the excess phase of the servo loop at $F_{SL}$ due to the delay $T_S/2$ should be less than about $\pi/8$ to permit, in most cases, a properly damped transient response servo. With this in mind, it follows that:

$$2\pi \cdot F_{SL} \cdot T_S/2 \leq \pi/8 \qquad (6a)$$

and, therefore $$F_{SL} \leq 1/8T_S = \frac{1}{8}\sqrt{2^N k/2} \qquad (7a)$$

Figure 2:
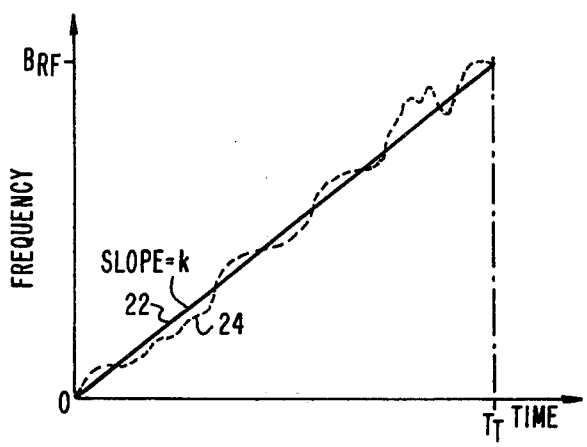
FIG. 2 is a graph depicting both desired and undesired frequency rate of change characteristics of the generated FM waveform.

In contrast with the conventional sampling linearizer described in connection with FIGS. 1, 2 and 3, it appears that by including the appropriately controlled N-bit phase shifter 40 shown in FIG. 4 disposed between the fixed oscillator 18 and mixer 15, the sampling rate and servo loop bandwidth of the linearizer may be increased by an amount $2^{N/2}$. Furthermore, if a type II servo controller is used at 36, the low order frequency gain of the servo control loop may be increased by $2^N$ yielding a proportional improvement in waveform linearity, noise and transient response, the properties of which are direct functions of achievable loop bandwidth.

Figure 4:
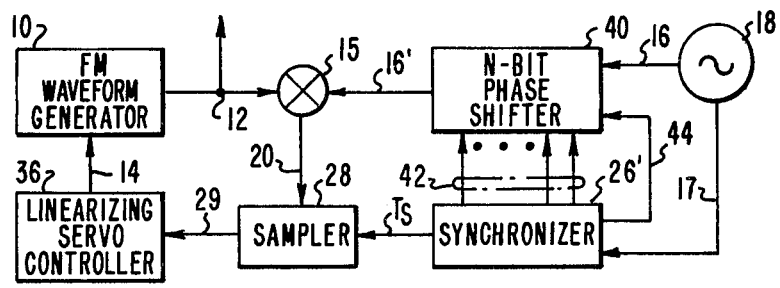
FIG. 4 is a schematic block diagram of a FM waveform generation system embodying the principles of the present invention.

Some exemplary figures achievable with the inclusion of the phase shifter 40 in the sampling linearizer as shown im FIG. 4 are found in the following table. A typical desired FM waveform with a frequency rate of change k of $12.5 \times 10^{12}$ Hz/second was used in calculating these figures and it was assumed that a type II servo controller was used at 36.

TABLE I

| N (bits) | $F_S$ (MHz) | $F_{SL}$ (Mhz) | Loop Gain Improvement (dB) |
|---|---|---|---|
| Conventional | 2.5 | .3125 | 0 |
| 2 | 5.0 | .625 | 12 |
| 4 | 10.0 | 1.25 | 24 |
| 6 | 20.0 | 2.5 | 36 |
| 8 | 40.0 | 5.0 | 48 |

It is evident by the figures provided in the above Table I that the limiting factor appears to be the speed by which the phase of signal 16' can be incrementally shifted within the sampling interval $T_S$ ($1/F_S$). For the example of an 8-bit digitally controlled phase shifter, $T_S$ is approximately 25 nanoseconds. To ensure a margin of safety for this example, a phase shifting time within about 15 nanoseconds appears to be required.

Referring to FIG. 4 again, in operation, the initial frequency $F_O$ of the generated FM waveform 12 is phase locked to the tuned frequency 16' of the oscillator 18 as described supra. As the linear FM waveform generator 10 starts to sweep through its desired linear frequency ramp which may go from 10 to 11 GHz in a time period of 10 to 100 microseconds, for example, the synchronizer 26' begins generating a digital control word shown at 42 which is representative of the phase shift change to be performed by the phase shifter 40 on signal 16 to generate the phase shifted signal 16'. The digital control word 42 may either be stored in memory (not shown) in the synchronizer 26' or it may be calculated using digital calculating methods embodied in the synchronizer 26'. In either case, the first digital control word is conducted from lines 42 to the N-bit phase shifter 40 and stored in a register therein by the gate signal 44 which may be generated by the synchronizer 26' also. A more detailed description of a synchronizer 26' and a phase shifter 40 suitable for use in the present embodiment will be provided herebelow. The first digital control word 42 is conducted and stored in the phase shifter 40 at a time within the first sampling interval between $T_O$ and $T_S$ (see FIG. 5) to permit the phase shifter 40 to alter the phase of signal 16' by the amount designated by the first digital control word. The resulting phase shifted signal 16' is mixed with the FM waveform signal 12 to produce a mixer output which is depicted by the waveform $20_1$ shown in FIG. 5.

Note that if the FM waveform 12 is within the specified accuracy requirements, the waveform $20_1$ will have a zero crossing at the first sampling point $T_S$ in which case, the error signal 29 will remain at substantially zero through the next sampling interval from $T_S$ to $2T_S$. However, should there exist a non-linear component in the generated FM waveform signal such as that depicted by the dotted line 24 in FIG. 2, the sampler 28 will capture a phase error with respect to the zero crossing of the waveform $20_1$ which will be used to govern the servo control 36 over signal line 29 over the time interval from $T_S$ to $2T_S$.

Figure 5:
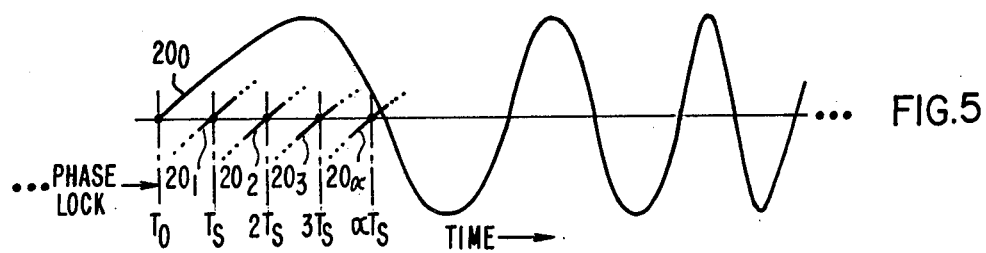
FIG. 5 is a sketch of a family of waveforms which illustrate the operation of the embodiment depicted in FIG. 4.

Likewise, during the next sampling interval from $T_S$ to $2T_S$, a second digital control word may be computed by the synchronizer 26' and conducted and stored in the phase shifter 40 to shift the phase of signal 16' a desired amount such that when mixed with the generated FM waveform 12, the waveform depicted by $20_2$ in FIG. 5 is produced at 20. Again, if the FM waveform 12 is within accuracy requirements, the waveform $20_2$ passes through a zero crossing at the next sampling time $2T_S$ and the phase error signal at 29 is set substantially to zero. Otherwise, if waveform 12 is in error, a phase error is captured with respect to the zero crossing of waveform $20_2$ and conducted over signal line 29 to govern the sero controller 36 during the next sampling time period $2T_S$ to $3T_S$. This operation is incrementally continued for each subsequent sampling time interval to phase shift the signal 16' to produce the waveforms $20_3$, ... $20_\alpha$, etc., all having zero crossings concurrent with the corresponding times O, $T_S$, $2T_S$, $3T_S$ ..., etc., if the generated FM waveform is considered to have a desired linear frequency rate of change or providing a representative phase error with respect to a common reference, which is for the purposes of this description zero, if the wave form 12 has an inaccurate frequency rate of change. Consequently, the sample-and-hold signal generated by the sampler 28 at 29 governs the linearizing servo controller 36 to tune the linear FM waveform generator 10 to bring the generated FM waveform 12 back within its accuracy specifications in a manner well known in the art.

Figure 6:
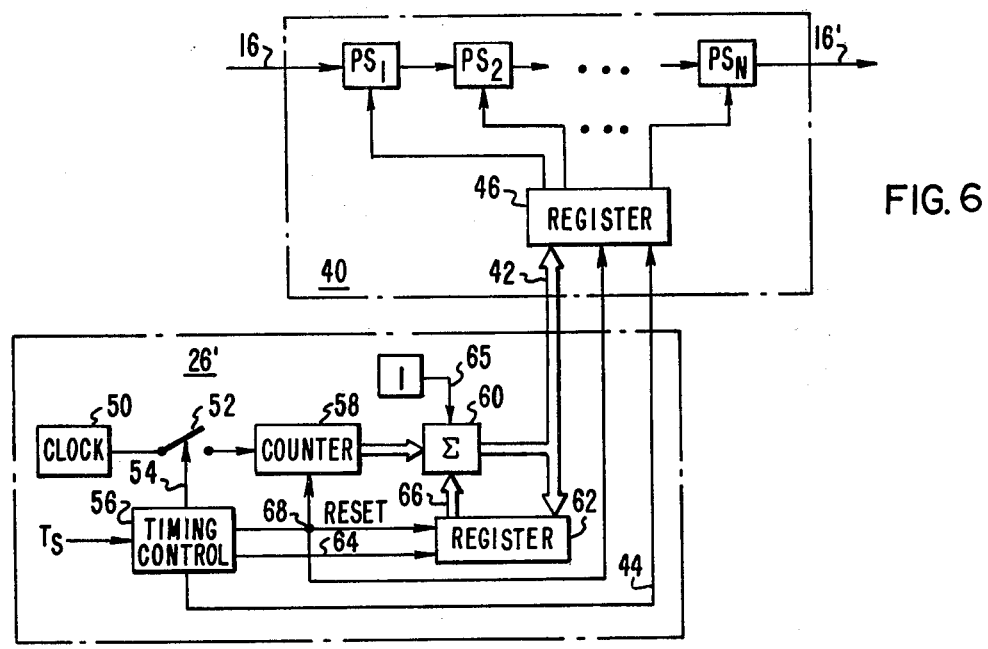
FIG. 6 is a more detailed schematic of a phase shifter and associated computing circuitry suitable for use in the embodiment of FIG. 4.

Referring to FIG. 6, the phase shifter 40 may be comprised of a number of individual phase shifting elements $PS_1, \ldots PS_N$ corresponding to the number of bits in the digital control word 42 governing their operation. A gate control signal 44 generated by the computing circuitry of the synchronizer 26' enables a register 46 in the phase shifter 40 to capture and hold the digital control word conducted thereto over signal lines 42. Each individual phase shifting element $PS_i$ is cascaded with the others to form a chain of elements in consecutive order such as $PS_1, PS_2 \ldots PS_N$, whereby $PS_1$ is operated by the least significant digital binary bit of the register 46 and so on until $PS_N$ which is operated by the most significant binary digital bit of the register 46. Each phase shifter element $PS_i$ may be of the type including a quadrature coupler having phase matching networks which may be comprised of coupled transmission lines generally configured in a microstrip circuit arrangement. The phase matching networks are switched between conducting and non-conducting states utilizing PIN diodes in a manner well known to those skilled in the pertinent art. Generally, when the state of the digital bit i controlling the phase shifter $PS_i$ is a "one", the PIN diodes are driven into conduction causing the phase matching network of $PS_i$ to induce a phase shift on the signal passing therethrough. Conversely, when the state of the digital bit i is a "zero," the PIN diodes are backbiased into non-conduction causing no phase shift to occur in the signal passing through the phase shifter $PS_i$.

In general terms, the phase matching networks (not shown) of the phase shifter elements $PS_i$ are designed to impart a phase shift $2\pi/2^{N-i}$, where i is the number representing the order in which the element are cascaded going from 0 to N−1, N being the number of bits in the shift register control word. For example, if N=6, then the shift register elements $PS_1$ corresponding to the least significant bit 0 in the control word imparts a phase shift of $2\pi/2^6$ or 5.625 degrees, and the next element $PS_2$ imparts a phase shift of $2\pi/2^5$ or 11.25 degrees and so on until $PS_N$ which imparts a phase shift of $2\pi/2$ or 180 degrees. In the example of N=6, the 6-bit binary coded control word stored in register 46 causes any one of 64 possible phase shift values each having a resolution of 5.625 degrees to be executed by the phase shifter 40. It is understood that the phase shifter 40 is not limited to 6 bits and that it may have as many bits as the linearity requires as long as the phase shifter elements $PS_i$ can change phase of the signal passing therethrough within the margins of the defined sampling interval $T_S$ as described supra. A more detailed description of a phase shifter element $PS_i$ which may be suitable for use in this embodiment is found in the copending U.S. patent application (W.E. 48,181), Ser. No. 935,284, filed concurrent herewith by J. Gipprich, which is incorporated by reference herein. It is further understood that the details of the phase shifter element in no way form any part of applicants' invention.

Also in FIG. 6, a suitable embodiment of a phase shift calculating circuit in synchronizer 26' is shown coupled to the phase shifter 40. Disposed in the calculating circuit, a conventional clock circuit 50 is coupled to one input of a gating function 52 which is controlled to open or close to pass clock pulses by a signal 54 generated by a timing control circuit 56. The output of the gating function 52 is coupled to counter 58 which accumulates the clock pulses passed by the gate 52. The binary word representative of the accumulated count of the counter 58 is coupled to one input of a typical adder function 60. A storage register 62 is enabled to capture the output binary digital word 42 of the adder 60 at specified times as determined by the gating signal 64 supplied by the timing control circuitry 56. The stored output word 66 of register 62 is provided to another input of the adder circuit 60. A third input of the adder 60 shown at 65 may be permanently tied to a signal representing a "one" in the least significant bit of the addition operation. The timing control circuit 56 may be governed by the sampling time signal $T_S$ which is derived in the synchronizer 26' utilizing the timing signal 17 provided from the oscillator 18 (see FIG. 4). This timing signal 17 ensures that the coupling time signal $T_S$ is synchronous to the frequency signal 16 generated by the oscillator 18. A reset signal 68 is conducted to the counter 58, register 62 and storage register 46 in the phase shifter 40 from the timing control circuit 56. Another gating signal 44 is provided to the storage register 46 in the phase shifter 40 from the timing control circuit 56. The gating signal 44 enables the register 40 to capture the control word 42 from the adder 60 at times specified by the timing control circuit 56. A more detailed description of the timing control is provided hereinbelow in connection with the timing wave forms of FIG. 7.

The control word 42 calculated by the circuitry shown in FIG. 6 is representative of the desired phase of the signal 20 as exhibited by the waveform 20 in FIG. 5 corresponding to the sequence of sampling time $\alpha T_S$. As shown by equation (4a) above, the phase $\phi(\alpha T_S)$ of the wave form 20 is proportional to the square of the successive sample number $\alpha$ or $\alpha^2$ for the case in which a linear frequency rate of change is desired. Since $\alpha$ consecutively increases in integer value by design (i.e., $\alpha = 0, 1, 2 \ldots, M$) a mathematical expression may be generated as follows:

$$a_{new}^2 = (a_{old}+1)^2 = a_{old}^2 + (2a_{old}+1) \qquad (8a)$$

Thus, each new phase $\phi(\alpha T_S)$ corresponding to the sampling time designated by $\alpha$ may be computed proportional to the expression shown above in equation (8a) which may be used as the basis for operation of the calculating circuit described above in connection with FIG. 6.

Figure 7:
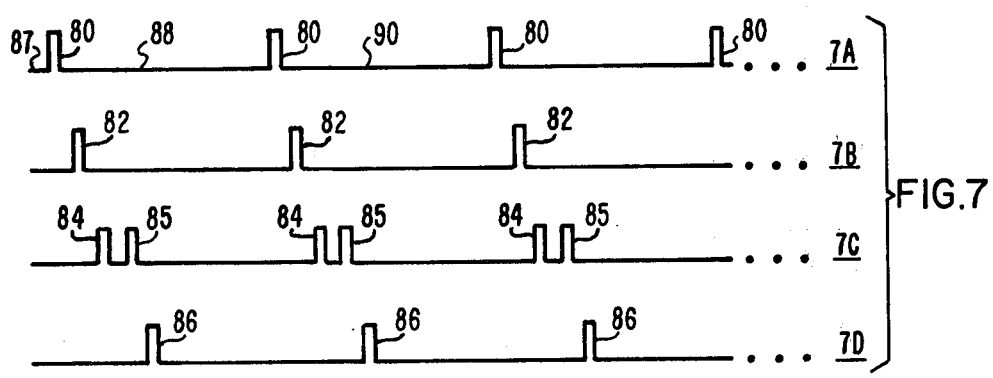
FIG. 7 is a set of timing diagrams exemplifying the operation of the computing circuitry of FIG. 6.

An example operation of the calculating circuit of FIG. 6 may be described utilizing the waveforms exhibited in FIG. 7. Each time the timing control circuit 56 receives a sampling pulse 80 (see waveform 6A) corresponding to the sampling times $\alpha T_S$ as shown in FIG. 5, it generates a gate pulse 82 (see waveform 8B) over signal line 64 to enable register 62 to capture and store the digital control word present on signal line 42 concurrent therewith. Thereafter, the timing control 56 causes the gate 52 to close for a period of time to permit 2 clock pulses 84 and 85 (see waveform 6C) to pass from the clock 50 to the counter 58 where they are accumulated. The accumulated count of counter 58 is added to the present value of present control word which is stored in register 62 and a least significant bit shown at 65 to produce a next control word corresponding to the next coupling time. Another gate pulse 86 (see waveform 6D) is then generated by a timing control circuit 56 over signal line 70 to enable the register 46 in the phase shifter 40 to capture and store the newly calculated control word which is proportional representative of the phase shift to be imparted to signal 16' for the corresponding next sampling time. The phase shifter elements PS$_1$, PS$_2 \ldots$, PS$_N$ respond to the states of the bits of the newly captured control word in register 46 to impart the desired phase shift represented thereby to the signal 16' to form the desired phase shifted signal at 20. Subsequent to a linear FM waveform sweep and prior to the next FM waveform sweep, a reset pulse is generated by the circuit 56 over line 68 to reduce the contents of the counter 58 and register 62 and 46 to a predetermined value, which is normally all "zeros".

A simple operation of the calculating circuit embodiment may be illustrated by first assuming that the counter 58 and registers 46 and 62 are at zero values (i.e. all bits are at a "zero" state). In the initial time interval 87 (see waveform 6A) between sampling times $T_O$ and $T_S$ the adder output 42 will simply be a one which will be stored in register 46 to cause waveform 16' to be shifted $2\pi/2^N$ degrees. During the next time interval 88 in waveform 6A, two pulses 84 and 85 will be gated to the counter 58 through gate 52 as controlled by the signal 54. The counter 58 now has an accumulated count of 2. Note that register 62 at this time contains the present digital control word 42 which has a value of 1. The addition of the three inputs of the adder 60 results in a newly calculated digital control word value of 4 corresponding to the sampling time $2T_S$. The newly calculated control word is captured and stored in register 46 by the gate pulse 86 generated over signal line 70 and the shift register elements PS$_1$, PS$_2 \ldots$, PS$_N$ respond to this control word by shifting wave form 16' by $4 \times 2\pi/2^N$ degrees. Similarly, in the next time interval 90, a value of 4 is stored in register 62, another two pulses are accumulated in counter 58 to increase the total to four and the result of the adder 60 then becomes nine corresponding to the next sampling time $3T_S$ and so on.

In this manner, a sequence of phase shift values in the form of digital control words may be generated sequentially corresponding to their sampling times. Each newly generated phase shift value causes the waveform over signal line 20 to exhibit substantially the characteristics as shown by the wave forms $20_1, 20_2 \ldots, 20\alpha$ in FIG. 5. Thus waveforms having simulated $2\pi$ multiple conditions at the predetermined sampling times $\alpha T_S$ are generated by the inclusion of the phase shifter 40 and associated timing and control circuitry shown at 26' into the conventional sampling linearizer described in connection with FIG. 1 (see FIG. 4).

It is desired that the present invention not be limited by the embodiments described in connection with FIGS. 5 through 7, because it is understood by those skilled in the pertinent art that any number of modifications and alterations may be made thereto without departing from the principles of applicants' invention. Rather, applicants prefer that their invention be construed in the breadth and scope of the claims to follow.

We claim:

1. A FM waveform generation system including a sampling linearizer for improving the accuracy of a generated FM waveform signal with respect to a desired frequency rate of change, said sampling linearizer comprising an oscillator for generating a signal at a predetermined reference frequency; a mixer governed by said FM waveform signal and another signal to generate a first signal representative of said generated FM waveform signal; a sampler for sampling said first signal at predetermined sampling times to generate a second signal representative of the inaccuracies in said generated FM waveform with respect to said desired frequency rate of change; a linearizing servo controller governed by said second signal to reduce said inaccuracies in said FM waveform generation; and a phase shifter disposed between said oscillator and said mixer and responsive to the predetermined reference frequency signal of said oscillator to generate said another signal, said phase shifter being operative to shift the phase of said another signal with respect to said predetermined reference frequency signal as governed by a sequence of control signals representative of predetermined phase shift values.

2. A sampling linearizer in accordance with claim 1 wherein the sequence of predetermined phase shift values are correspondingly based on a sequence of desired phase values of said first signal which are concurrent to said predetermined sampling times.

3. A sampling linearizer in accordance with claim 2 wherein the desired frequency rate of change is linear; and wherein each predetermined phase shift value is proportional to the square of the accumulated sampling time corresponding thereto, said each phase shift value being limited to the approximate range of 0 to $2\pi$.

4. A sampling linearizer in accordance with claim 3 wherein the predetermined sampling times are separated by uniform time intervals, $T_S$; and wherein each predetermined phase shift value may be expressed by the following expression:

$$\phi(\alpha) = \pi k(\alpha T_S)^2,$$

where $\alpha$ is the accumulated integer number of sampling times, k is the desired frequency rate of change of the generated FM waveform, and $\phi(\alpha)$ is modulo $2\pi$ that is greater than or equal to zero and less than $2\pi$.

5. A sampling linearizer in accordance with claim 2 wherein each phase shift signal governs the phase shifter to conduct a phase shift operation in the sampling time interval which is immediately prior to the sampling time corresponding to said governing phase shift signal.

6. A sampling linearizer in accordance with claim 1 wherein each phase shift operation causes the first signal to have a common reference value concurrent with the predetermined sampling times at times when the frequency of the generated FM waveform signal is changing substantially at said desired rate and causes the second signal to have value indicative of a phase error with respect to said common reference value concurrent with the predetermined sampling times at times when the frequency of the generated FM waveform signal is not changing substantially at said desired rate.

7. A sampling linearizer in accordance with claim 6 wherein the common reference value is substantially zero.

8. A FM waveform generation system including a sampling linearizer for improving the accuracy of a generated FM waveform signal with respect to a desired frequency rate of change, said sampling linearizer comprising an oscillator for generating a signal at a predetermined reference frequency; a mixer governed by said FM waveform signal and another signal to generate a first signal representative of said generated FM waveform signal; a sampler for sampling said first signal at predetermined sampling times to generate a second signal representative of the inaccuracies in said generated FM waveform with respect to said desired frequency rate of change; a linearizing servo controller governed by said second signal to reduce the inaccuracies in said FM waveform generation; and an N-bit digital phase shifter disposed between said oscillator and said mixer and responsive to the predetermined reference frequency signal of said oscillator to generate said another signal, said N-bit digital phase shifter being governed by a precalculated sequence of digital control words to shift the phase of said another signal with respect to said predetermined reference frequency signal.

9. A sampling linearizer in accordance with claim 8 wherein said phase shift sequence occurs in relation to the sampling times.

10. A sampling linearizer in accordance with claim 8 wherein each digital control word is representative of a desired phase shift of the another signal with respect to the predetermined reference frequency signal, said each desired phase shift rendering the first signal at a predetermined reference value concurrent with each sampling time when the frequency of the generated FM waveform is changing substantially at the desired rate and at a phase error value with respect to said predetermined reference value concurrent with each sampling time when the frequency of the generated FM waveform is not changing substantially at the desired rate.

11. A sampling linearizer in accordance with claim 10 wherein the predetermined reference value is zero, whereby the first signal passes through a zero crossing concurrent with each sampling time when the frequency of the generated FM waveform is changing substantially at the desired rate.

12. A sampling linearizer in accordance with claim 8 wherein the desired frequency rate of change is linear; and wherein the predetermined sampling times are separated by uniform time intervals, $T_S$; and wherein each digital control word in the sequence is precalculated proportionately based on the following expression:

$$\phi(\alpha) = \pi k(\alpha T_S)^2,$$

where $\alpha$ is the accumulated integer number of sampling times, k is the desired frequency rate of change of the generated FM waveform, and $\phi(\alpha)$ is modulo $2\pi$ that is greater than or equal to zero and less than $2\pi$.

13. A sampling linearizer in accordance with claim 12 wherein the N-bit phase shifter is governed by the digital control word representative of $\phi(\alpha)$ between successive sampling times denoted by $\alpha-1$ and $\alpha$ to shift the phase of the another signal with respect to the predetermined reference frequency signal by an amount proportional to $\phi(\alpha)$.

14. A sampling linearizer in accordance with claim 13 wherein the phase shift of the another signal which is conducted within the period between sampling times denoted by $\alpha-1$ and $\alpha$ is substantially concluded prior to the sampling time denoted as $\alpha$.

15. A sampling linearizer in accordance with claim 14 wherein the phase shift of the another signal which is conducted within the period between sampling times denoted by $\alpha-1$ and $\alpha$ causes the first signal to have a zero crossing concurrent with the sampling time denoted as $\alpha$ when the frequency of the generated FM waveform is changing substantially at the desired linear rate and causes the second signal to have a phase error with respect to the zero crossing concurrent with the sampling time denoted as $\alpha$ when the frequency of the generated FM waveform is not changing substantially at the desired linear rate.

* * * * *